(12) United States Patent
Notsch

(10) Patent No.: US 10,389,275 B2
(45) Date of Patent: Aug. 20, 2019

(54) CONVERTER WITH ZVS

(71) Applicant: Infineon Technologies Austria AG, Villach (AT)

(72) Inventor: Chris Josef Notsch, Villach (AT)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 0 days.

(21) Appl. No.: 15/865,424

(22) Filed: Jan. 9, 2018

(65) Prior Publication Data

US 2019/0214922 A1 Jul. 11, 2019

(51) Int. Cl.
| | |
|---|---|
| *H02M 3/335* | (2006.01) |
| *H02M 7/5387* | (2007.01) |
| *H02M 3/337* | (2006.01) |
| *H02M 3/28* | (2006.01) |
| *G06F 17/50* | (2006.01) |

(52) U.S. Cl.
CPC .......... *H02M 7/5387* (2013.01); *G06F 17/50* (2013.01); *H02M 3/285* (2013.01); *H02M 3/337* (2013.01); *H02M 3/33507* (2013.01); *H02M 3/33569* (2013.01)

(58) Field of Classification Search
CPC . H02M 2001/0054; H02M 2001/0058; H02M 3/335; H02M 3/33507; H02M 3/33523; H02M 3/3353; H02M 3/33569; H02M 3/33576; H02M 3/33592
See application file for complete search history.

(56) References Cited

U.S. PATENT DOCUMENTS

| | | | |
|---|---|---|---|
| 4,953,068 A | 8/1990 | Henze | |
| 6,108,218 A | 8/2000 | Igarashi et al. | |
| 8,026,704 B2 | 9/2011 | Kapels et al. | |
| 8,942,018 B2 | 1/2015 | Ho et al. | |
| 9,899,929 B2* | 2/2018 | Jitaru | H02M 3/3353 |
| 9,985,546 B2* | 5/2018 | Jitaru | H02M 3/33592 |
| 2002/0126509 A1 | 9/2002 | Liang | |
| 2012/0218785 A1 | 8/2012 | Li et al. | |
| 2014/0254208 A1 | 9/2014 | Dai et al. | |

(Continued)

FOREIGN PATENT DOCUMENTS

| | | |
|---|---|---|
| CN | 201018423 Y | 2/2008 |
| CN | 101814840 A | 8/2010 |
| EP | 2685620 A1 | 1/2014 |

OTHER PUBLICATIONS

Andreycak, B, "Zero Voltage Switching Resonant Power Conversion", Unitrode Application Note, U-138, Sep. 5, 1999, 28 pages.

(Continued)

*Primary Examiner* — Gary L Laxton
(74) *Attorney, Agent, or Firm* — Slater Matsil, LLP

(57) ABSTRACT

A method of operating a converter includes a transformer having a first winding and a second winding; a first full-bridge coupled to the first winding of the transformer; and a second full-bridge coupled to the second winding of the transformer. The method includes: injecting an auxiliary current into the second full-bridge, where the injected auxiliary current causes a voltage across a transistor of the first full-bridge to decrease; and turning on the transistor of the first full-bridge a first time period after injecting the auxiliary current.

25 Claims, 7 Drawing Sheets

(56) References Cited

U.S. PATENT DOCUMENTS

2015/0023063 A1     1/2015   Perreault et al.
2016/0020701 A1*   1/2016   Jitaru ................ H02M 3/33576
                                                                                     363/16

OTHER PUBLICATIONS

Choi, Hang-Seok, et al., "Novel Zero-Voltage and Zero-Current-Switching (ZVZCS) Full-Bridge PWM Converter Using Coupled Output Inductor", Browse Journals & Magazines, IEEE Transactions on Power EI, vol. 17 Issue 5, Sep. 2002, 8 pages.

Choi, Hang-Seok, et al., "Novel Zero-Voltage and Zero-Current-Switching (ZVZCS) Full-Bridge PWM Converter Using Coupled Output Inductor", Departement of Electrical Engineering, Seoul National University, Seoul, Korea, Nov. 7, 2002, 7 pages.

Dudrik, J. et al., "High-Frequency Soft-Switching DC-DC Conterters for Voltage and Current DC Power Sources", Department of Electrical, Mechatronic and Industrial Engineering, Acta Polytechnica Hungarican, vol. 4, No. 2, Aug. 2007, 18 pages.

Perdul'Ak, J. et al., "Novel Zero-Voltage and Zero-Current Switching Full-Bridge PWM Converter Using Simple Secondary Active Clamp Circuit", Dept. of Electrical Engineering, Mechatronics and Industrial Engineering, FEI TU of Kosice, Slovak Republic, Oct. 23-26, 2010, 4 pages.

Texas Instruments, "Phase-Shifted Full Bridge DC/DC Power Converter Design Guide", TIDU248—May 2017, 56 pages.

Texas Instruments, "Phase-Shiffted Full-Bridge, Zero-Voltage Transition Design Considerations", Application Report, Literature No. SLUA07A, Sep. 1999—Revised Aug. 2011, 19 pages.

* cited by examiner

CONVERTER WITH ZVS

TECHNICAL FIELD

The present invention relates generally to an electronic device, and more particularly to a converter with zero-voltage switching (ZVS).

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switch-mode power supply (SMPS). An SMPS is usually more efficient than other types of power conversion systems because power conversion is performed by controlled charging and discharging of the inductor or transformer and reduces energy lost due to power dissipation caused by resistive voltage drops.

Specific topologies of SMPS include buck converters, boost converters, buck-boost converters and fly-back converters, among others. Depending on the topology selected and the needs of a particular system, the SMPS may be implemented using a half-bridge architecture, a full bridge architecture, or with any other implementation known in the art.

A transformer may be used in some cases, such as in the case of a fly-back converter. For example, a DC-DC converter including a transformer may have a full bridge in the primary side of the transformer and may have diodes in the secondary side of the transformer to perform the rectification process. In some cases, synchronous rectifier techniques may be used, in part, to improve the efficiency of the system. That is, the DC-DC converter may use switches in the secondary side of the transformer instead of diodes to perform the synchronous rectification process. Each switch in the secondary side may turn on during the time the diode would have been forward biased and may turn off during the time when the diode would have been reversed biased.

SUMMARY

In accordance with an embodiment a method of operating a converter includes a transformer having a first winding and a second winding; a first full-bridge coupled to the first winding of the transformer; and a second full-bridge coupled to the second winding of the transformer. The method includes: injecting an auxiliary current into the second full-bridge, where the injected auxiliary current causes a voltage across a transistor of the first full-bridge to decrease; and turning on the transistor of the first full-bridge a first time period after injecting the auxiliary current.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, a full bridge converter operated as a phase-shifted full-bridge with synchronous rectification as well as ZVS for primary side switches and synchronous rectification switches. Embodiments of the present invention may also be applied to other circuits utilizing phase-shifted synchronous rectified full bridges as well as other converter topologies. Embodiments of the present invention may also be implemented in amplifiers and non-phase-shifted topologies.

In an embodiment of the present invention, ZVS is achieved in the primary and secondary side of a full-bridge converter by injecting a current in the secondary side of the converter shortly before a switch is turned on. In some embodiments, the primary side of the full bridge converter may be operated as a phase-shifted full-bridge. The secondary side of the full-bridge converter may be operated as a center-tap or full-bridge synchronous rectifier.

SMPS systems typically include multiple transistors that operate at high frequencies, such as 100 kHz or higher. In other words, transistors in SMPS systems may turn on and off at high frequencies during normal operation. When a transistor is off, a voltage across its load path may develop. When a transistor with a voltage greater than zero across its load path turns on, the parasitic output capacitance may discharge through the load path of the transistor, dissipating power. Such power loss may be significant, especially at high frequencies and high voltages. A way to improve power efficiency, therefore, is by having zero volts across the load path of the transistor when turning the transistor on.

In some embodiments of the present invention, an auxiliary circuit injects an auxiliary current into the secondary side of a full-bridge converter before the primary side of the full-bridge converter switches. An auxiliary inductance is used to generate the auxiliary current. An auxiliary capacitor provides the energy for injecting the auxiliary current.

Figure 1A:
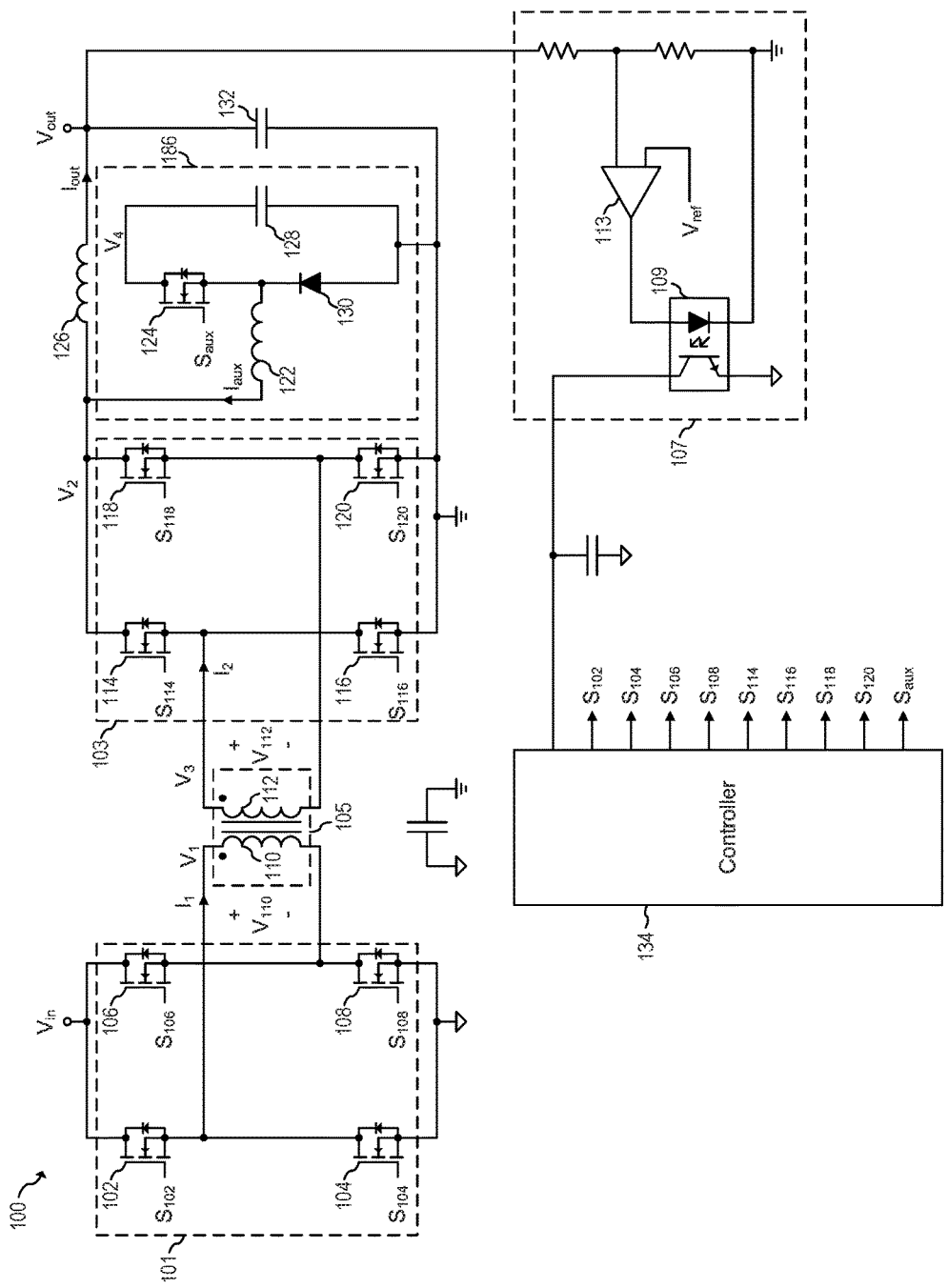
FIG. 1A shows a full-bridge converter, according to an embodiment of the present invention.

FIG. 1A shows full-bridge converter 100, according to an embodiment of the present invention. Full-bridge converter 100 includes full-bridges 101 and 103, transformer 105, auxiliary circuit 186, inductor 126, capacitor 132, feedback circuit 107, and controller 134. Full-bridge 101 includes transistors 102, 104, 106, and 108. Full-bridge 103 includes transistors 114, 116, 118, and 120. Transformer 105 includes primary winding 110 and secondary winding 112. Auxiliary circuit 186 includes auxiliary transistor 124, auxiliary inductor 122, auxiliary diode 130, and auxiliary capacitor 128.

Full-bridge converter 100 may provide a regulated voltage at output $V_{out}$, which may be coupled to a load (not shown). During normal operation, full-bridge 101 is operated as a phase-shifted full-bridge while full-bridge 103 is operated as a full-bridge synchronous rectifier. Auxiliary circuit 186 may inject auxiliary current $I_{aux}$ into full-bridge 103, which may create ZVS for transistors of full-bridge 101. The injected auxiliary current $I_{aux}$ may also create ZVS for transistors of full-bridge 103. In other words, the voltage commutation of full-bridge 101 and full-bridge 103 may be induced by injected auxiliary current $I_{aux}$, allowing for ZVS for transistors of full-bridge 101 and full-bridge 103. In some embodiments, non-full-bridge rectifiers, such as, for example, a center-tap rectifier, may be used instead of full-bridge rectifier 103.

During normal operation, full-bridge 101 may transition between four different states. In a first state, full-bridge 101 has transistors 102 and 108 on and transistors 104 and 106 off. When full-bridge 101 is in the first state, voltage $V_{110}$ across primary winding 110 may be positive, which in turn may induce primary current $I_1$ to flow from input $V_{in}$, through transistor 102, primary winding 110, transistor 108 and to ground. Voltage $V_{110}$ may cause, via magnetic coupling, voltage $V_{112}$ to be positive, which in turn may induce secondary current $I_2$ to flow through secondary winding 112 towards output $V_{out}$. When current $I_2$ is flowing through secondary winding 112, full-bridge 103 may be in a first state, where transistors 114 and 120 are on, and transistors 116 and 118 are off. Secondary current $I_2$, therefore, may flow from ground, through transistor 120, secondary winding 112, transistor 114 and towards output $V_{out}$. Alternatively, secondary current $I_2$ may flow through the body diodes of transistors 120 and 114.

In a second state, full-bridge 101 has transistors 102 and 108 off and transistors 104 and 106 on. When full-bridge 101 is in the second state, voltage $V_{110}$ may be negative, which in turn may induce primary current $I_1$ to flow from input $V_{in}$, through transistor 106, primary winding 110, transistor 104, and to ground. Since voltage $V_{110}$ is negative, voltage $V_{110}$ may cause voltage $V_{112}$ to be negative, which in turn may induce secondary current $I_2$ to flow in opposite direction. When full-bridge 101 is in the second state, therefore, full-bridge 103 may be in a second state, where transistors 114 and 120 are off, and transistors 116 and 118 are on. Secondary current $I_2$ may flow from ground, through transistor 116, secondary winding 112, transistor 118 and towards output $V_{out}$ when full-bridge 103 is in the second state. Alternatively, secondary current $I_2$ may flow through the body diodes of transistors 116 and 118. When discussing changes in polarity across primary and secondary winding, it is understood that a change in voltage polarity across the primary or secondary winding may not necessarily imply a change in primary or secondary current direction.

In a third state, full-bridge 101 has transistors 102 and 106 on and transistors 104 and 106 off. In a fourth state, full-bridge 101 has transistors 102 and 106 off and transistors 104 and 106 on. When full-bridge 101 is in either the third and fourth states, voltage $V_{110}$ may be zero. No power may be transferred, therefore, when full-bridge 101 is in either the third or fourth state. When full-bridge 101 is in either the third or four states, full-bridge 103 may be in a third state where transistors 114, 116, 118, and 120 are on. Shorting full-bridge 103 may provide a low impedance path for output current $I_{out}$ to flow. In some embodiments, when full-bridge 101 is in either the third or four states, full-bridge 103 may be in a state different from the third state, such as, for example, having transistors 114, 116, 118, and 120 off.

Full-bridge 101 may operate according to a technique known as phase-shifting. When full-bridge 101 is operated as a phase-shifted full bridge, full-bridge 101 may go from its first state to its third state, then to its second state, then to its fourth state, and then back to its first state, repeating the sequence. Because of the rectifying nature of the switching scheme, node $V_2$ may have a voltage waveform that looks like a PWM signal, where the width of the voltage at node $V_2$ determines the amplitude of the voltage at output $V_{out}$. The duration of time that full-bridge 101 spends in the first and second states versus the duration of time that full-bridge 101 spends in the third and fourth states determines the duty cycle of the PWM waveform at node $V_2$ and ultimately the voltage at output $V_{out}$. For example, when full-bridge 101 spends all of its time in the third and fourth states and no time in the first and second states, voltage $V_{110}$ across primary winding 110 may be zero, voltage $V_{112}$ across secondary winding 112 may be zero, and the voltage at output $V_{out}$ may be zero. Similarly, when full-bridge 101 spends all of its time in the first and second states and no time in the third and fourth states, node $V_2$ may have a voltage that is high all the time. Consequently, the voltage at output $V_{out}$ may be at its maximum.

To achieve ZVS in full-bridge converter 100, auxiliary circuit 186 may inject auxiliary current $I_{aux}$ into node $V_2$ shortly before and/or during the turn on of transistors of full-bridge 101 (e.g., before and/or during the transition of full-bridge 101 from its third or fourth state into the first/ second state). At the time auxiliary current is injected, output current $I_{out}$ may be pulling down the voltage at node $V_2$. The injection of auxiliary current $I_{aux}$ into node $V_2$ may cause the voltage at node $V_2$ to increase, and may cause voltage $V_{112}$ to commutate. The injection of auxiliary current $I_{aux}$ into node $V_2$ may also flip the operation of transformer 105 during this time, where secondary winding 112 temporarily behaves as the primary winding and primary winding 110 temporarily behaves as the secondary winding. In other words, injecting auxiliary current $I_{aux}$ into node $V_2$ may raise voltage $V_{112}$, which in turned may cause voltage $V_{110}$ to commutate, creating ZVS for the transistors in full-bridge 101. Since output current $I_{out}$ may pull down the voltage at node $V_2$ when full-bridge 101 is either in the third or fourth state, transistors 114, 116, 118, and 120 may be turned on with ZVS when full-bridge 101 either transitions from the first state to the third state or from the second state to the fourth state without using auxiliary circuit 186. Having the transistors in full-bridge 101 and 103 switching with ZVS during normal operation may reduce switching losses of full-bridge converter 100.

When auxiliary current $I_{aux}$ is injected into node $V_2$, auxiliary transistor 124 may be on and the voltage across inductor 122 may be given by the difference in voltages between nodes $V_4$ and $V_2$. Since auxiliary transistor 124 may be turned on when full-bridge 101 is either in the third or fourth state, full-bridge 103 may be shorted and the voltage at node $V_2$ may be lower than the voltage at node $V_4$. The voltage at node $V_2$ during this time may be, for example, zero volts. During the injection of auxiliary current $I_{aux}$ into node $V_2$, it is possible that node $V_2$ may become higher than the voltage at node $V_4$. The voltage at node $V_2$ may be higher than the voltage at node $V_4$, for example, due to the current being injected pulling up node $V_2$ and/or auxiliary capacitor 128 being discharged. When auxiliary transistor 124 turns off, auxiliary diode 130 may provide a current path for auxiliary current $I_{aux}$ to recirculate. Auxiliary diode 130 may also limit the voltage across auxiliary transistor 124.

Charging of auxiliary capacitor 128 may be achieved through the body diode of auxiliary transistor 124. For example, when auxiliary current $I_{aux}$ is not being injected, auxiliary transistor 124 may be off, and auxiliary capacitor 128 may be charged through the body diode of auxiliary transistor 124 during times when the voltage at node $V_2$ is higher than the voltage at node $V_4$. In some embodiments, auxiliary transistor 124 may be turned on during its body diode conduction time to further reduce losses. In some embodiments, diode 130 may be replaced with a synchronous rectifier.

Output $V_{out}$ may be regulated by using feedback circuit 107 and controller 134. Controller 134 may sense the voltage at output $V_{out}$ through feedback circuit 107 and may determine the amount of time full-bridge 101 spends in the first, second, third and fourth state such that a desired voltage at output $V_{out}$ is produced. In other words, Controller 134 may operate full-bridge converter 100 as a phase-shifted full bridge and may control the phase-shift such that the desired voltage at output $V_{out}$ is produced. Regulating output $V_{out}$ may be accomplished by any method known in the art, such as by having an open-loop controller, or a closed-loop controller.

Controller 134 is coupled to the control nodes of transistors 102, 104, 106, 114, 116, 118, 120, and auxiliary transistor 124 and may be implemented as a single controller. Coupling the controller to transistors 102, 104, 106, 114, 116, 118, 120, and auxiliary transistor 124 may be achieved through direct electrical connection or indirect electrical connections. For example, opto-couplers may be used to electrically isolate the controller from other parts of the circuit. Coupling between controller 134 and other components of full-bridge converter 100 may also be achieved in other ways known in the art.

Controller 134 may be implemented as a single chip. Alternatively, controller 134 may be implemented as a collection of controllers, such as, for example, a synchronous rectifier controller for controlling full-bridge 103, a phase-shifted controller for controlling full-bridge 101, and an auxiliary controller for controlling auxiliary circuit 186. Other implementations are also possible.

Feedback circuit 107 may be implemented in any way known in the art. For example, feedback circuit may include opto-coupler 109 coupled to a voltage divider coupled to output voltage $V_{out}$. Including a reference, such as Vref, and an error amplifier, such as amplifier 113, between the voltage divider and opto-coupler may improve the precision of the feedback circuit.

Transistors 102, 104, 106, 108, 114, 116, 118, 120 may all be NMOS transistors. Alternatively, not all transistors may be of the same type. Other types of transistors may be used. For example, transistors of the n-type and p-type, metal oxide semiconductor field effect transistors (MOSFETs), power MOSFETs, junction field effect transistor (JFETs) high electron mobility transistor (HEMT) such as gallium nitride (GaN) HEMTs and insulated gate bipolar transistors (IGBTs), and others. The selection of transistor type may be made according to the system requirements. Appropriate adjustments to the circuit may be made to accommodate the particular device type, such as, for example, including additional diodes or inverting the control signal polarities.

Auxiliary transistor 124 may be an NMOS transistor. Alternatively, a switch or other types of transistors may be used. For example, transistors of the n-type and p-type, MOSFETs, power MOSFETs, JFETs, HEMT such as GaN HEMTs and IGBTs, mechanical or solid state relays, and others. The selection of transistor type may be made according to the system requirements. Appropriate adjustments to the circuit may be made to accommodate the particular device type, such as, for example, including additional diodes or inverting the control signal polarities.

Advantages of some embodiments include that ZVS can be achieved for all transistors of the full-bridge on the primary side of the full-bridge converter as well as for all the transistors of the full-bridge on the secondary side of the full-bridge converter. ZVS can also be achieved across loads, including zero load. Since the current is being injected by an auxiliary circuit, ZVS is achieved independently from the amount of leakage inductance of the transformer and even if the transformer has negligible or no leakage inductance. For example, ZVS may be achieved when the transformer has a leakage inductance of 1% of the magnetizing inductance or lower. ZVS may be achieved when the transformer has higher leakage inductance, such as a leakage inductance of 10% of the magnetizing inductance or more. In other words, a transformer with good primary-to-secondary coupling may be used while still achieving ZVS across the full-range of power operation. Using a transformer with good primary-to-secondary coupling may further increase the efficiency of the converter.

Figure 1B:
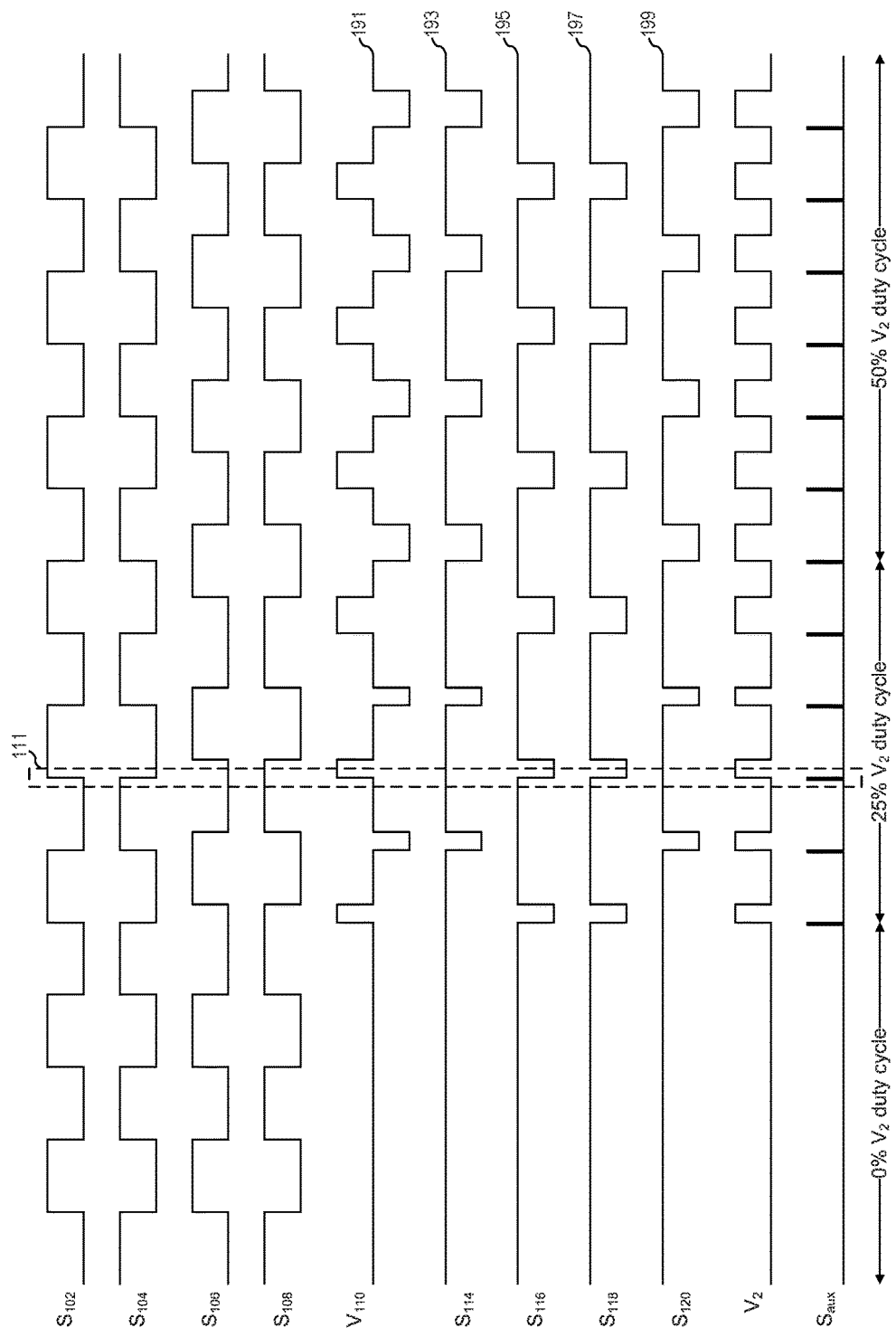
FIG. 1B shows a timing diagram of a full-bridge converter, according to an embodiment of the present invention.

The operation of full-bridge converter 100 as shown in FIG. 1A may be understood in light of FIG. 1B. FIG. 1B shows a timing diagram of full-bridge converter 100, according to an embodiment of the present invention. Specifically, FIG. 1B shows full-bridge 101 switching according to a phase-shifted operation and full-bridge 103 switching according to a synchronous rectifier switching scheme. Voltage $V_{110}$ across primary winding, the voltage at node $V_2$ and auxiliary signal $S_{aux}$ are also shown.

As can be seen from FIG. 1B, signal $S_{102}$ may have opposite polarity to signal $S_{104}$, and signal $S_{106}$ may have opposite polarity to signal $S_{108}$. Such opposite polarity prevents shoot-through current from going from input $V_{in}$ to ground. A dead-time (not shown) and other delays (not shown) during switching transitions may be used, in part, to ensure that transistor 102 and 104, or transistor 106 and 108, are not on at the same time. Since transistors 102 and 104 may be controlled such that they are of opposite polarity, transistors 102 and 104 may be identified as the first leg of full-bridge 101. Similarly, transistors 106 and 108 may be identified as the second leg of full-bridge 101. Signals $S_{102}$, $S_{104}$, $S_{106}$ and $S_{108}$ may switch with duty cycle of 50%, which may allow for a phase-shift between the first leg and second leg of full-bridge 101 ranging from zero degrees of phase-shift to 180 degrees of phase-shift.

During normal operation, the amount of phase-shift between the first leg and the second leg of full-bridge 101 may determine the voltage at output $V_{out}$. For example, as shown by curve 191, when there is zero degree phase-shift between the first leg and the second leg of full-bridge 101, voltage $V_{110}$ may be zero. In other words, there may be zero voltage across primary winding 110. In such case, voltage $V_{112}$ and the voltage at node $V_2$ may also be zero. Transistors

114, 116, 118, and 120 may be all on during this time, as shown by curves 193, 195, 197 and 199. Since the first leg transitions before or at the same time as the second leg, the first leg may also be referred to as the leading leg, and the second leg may be referred to as the lagging leg.

When there is forty-five degrees of phase-shift between the first leg and the second leg of full-bridge 101, voltage $V_{110}$ may be non-zero during 25% of the time. When signal $S_{102}$ is higher than signal $S_{106}$, voltage $V_{110}$ may be positive, and when signal $S_{102}$ is lower than signal $S_{106}$, voltage $V_{110}$ may be negative. When voltage $V_{110}$ is non-zero, energy may be transferred from the primary side of transformer 105 to the secondary side of transformer 105. Signals $S_{114}$, $S_{116}$, $S_{118}$, and $S_{120}$ may turn on and off according to the synchronous rectification process, as shown by curves 193, 195, 197 and 199. The synchronous rectification therefore, may produce a PWM signal at node $V_2$ with 25% duty cycle.

Similarly, when there is ninety degrees of phase-shift between the first leg and the second leg of full-bridge 101, voltage $V_{110}$ may be non-zero during 50% of the time, which may produce a PWM signal at node $V_2$ with 50% duty cycle.

Auxiliary signal $S_{aux}$ may transition from low to high during the dead-time of signals $S_{102}$ and $S_{104}$ and before the first leg of full-bridge 101 transitions. For example, auxiliary signal $S_{aux}$ may transition from low to high 100 ns before the signals $S_{102}$ or $S_{104}$ transitions. Other times may be used. In some embodiments, auxiliary signal $S_{aux}$ may transition from low to high at the same time or shortly after signals $S_{102}$ or $S_{104}$ transitions. In such cases, ZVS is achieved as long as voltage $V_{110}$ commutates prior to transistors 102 and 104 switching. Among the factors that may affect the timing of switching signals $S_{aux}$, $S_{102}$ and $S_{104}$ are the switching speed, gate capacitance, propagation delay between signals $S_{aux}$, $S_{102}$ and $S_{104}$ and their respective gates.

The duration of the pulse of auxiliary signal $S_{aux}$ may be adjusted to accomplish ZVS. For example, auxiliary signal $S_{aux}$ may be high long enough to allow for voltage $V_{110}$ to transition. In some embodiments, the pulse duration may be 100 ns. Other embodiments may implement a pulse duration of 10 ns. It is understood that the pulse duration may be shorter or longer than the exemplary values provided depending on the characteristics of the particular system. The duration of the pulse and how early it is produced may depend on, for example, the switching frequency, the circuit topology and the values of auxiliary circuit components, such as the capacitance of auxiliary capacitor 128, the inductance of auxiliary inductor 122, the on-resistance of auxiliary transistor 124, the combined capacitances of transistors of full-bridges 101 and 103, the characteristics of transformer 105, the inductance of inductor 126, the value of output current $I_{out}$, and/or a combination thereof. In particular, for example, a minimum on-time of auxiliary transistor 124 may be calculated based on the effective auxiliary charge delivered into full bridges 101 and 103, which is impacted by auxiliary current $I_{aux}$ and the momentary output of output current $I_{out}$.

Figure 1C:
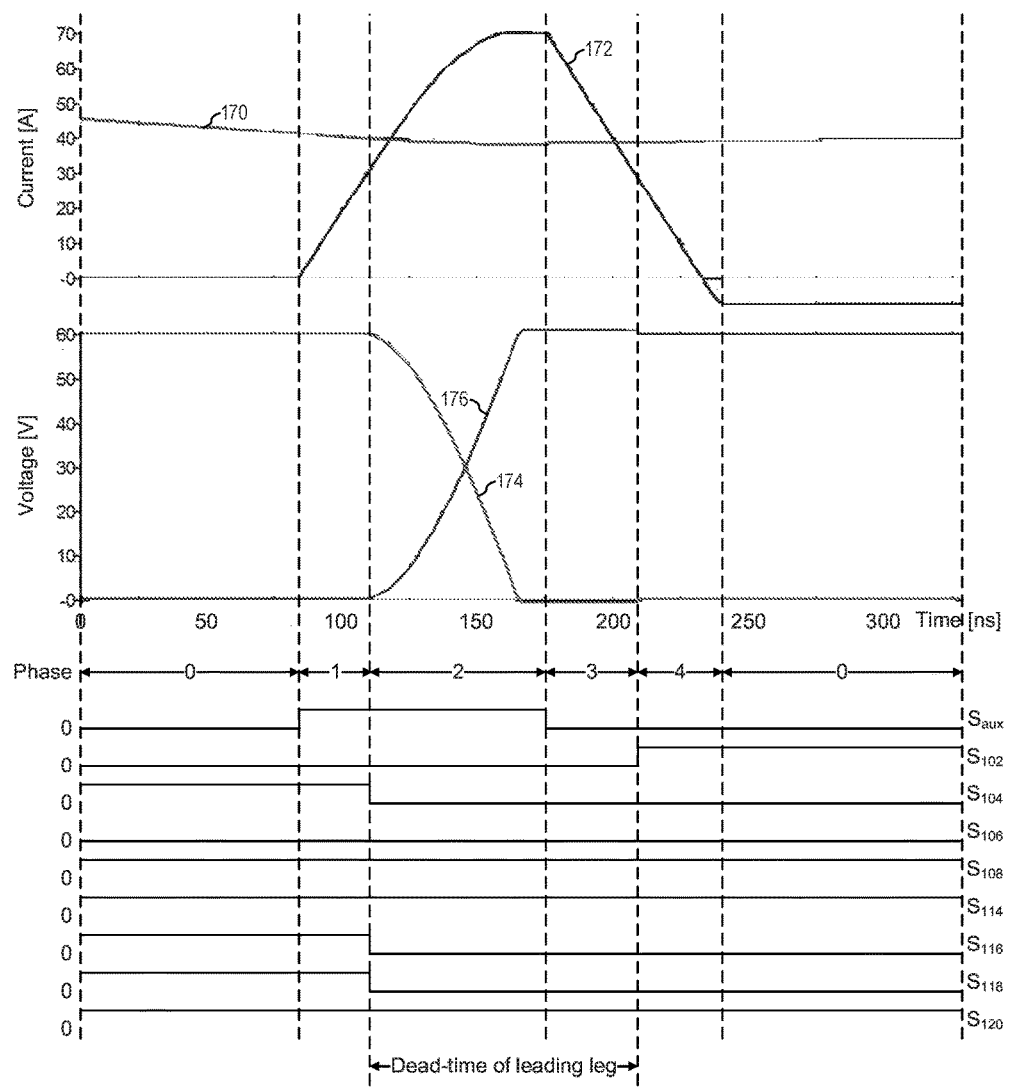
FIG. 1C shows voltage and current waveforms of a full-bridge converter, according to an embodiment of the present invention.

The timing in which transistors are turned on may affect whether the transistors switch with ZVS or quasi-ZVS (QZVS). FIG. 1C shows voltage and current waveforms as well as the timing of the control signals of full-bridge converter 100 during switching transition 111, as shown in FIG. 1B, according to an embodiment of the present invention. Curve 170 represents output current $I_{out}$, curve 172 represents auxiliary current $I_{aux}$, curve 174 represents the drain-to-source voltage $V_{ds}$ of transistor 102, and curve 176 represents the voltage at node $V_3$, where transformer 105 has a 1:1 ratio.

There may be four main phases to a switching transition of full-bridge converter 100. An additional phase 0 corresponds to the time where a transition has either not started or has already finished and during which auxiliary capacitor 128 may be charged. Phases 1-4 correspond to the 4 main switching phases.

Phase 1 may be optional, and may be used to pre-charge inductor 122. While pre-charging auxiliary inductor 122, transistors 114, 116, 118, and 120 may be on. In other words, full-bridge 103 may be shorted during the pre-charge phase. Auxiliary transistor 124 may turn on at the beginning of phase 1, as shown by signal $S_{aux}$. Current flowing through auxiliary inductor 122 may continually increase during phase 1, as shown by curve 172. During phase 1, current may flow through transistors 114, 116, 118, and 120, with little or no current flowing through secondary winding 112. Current flowing through transistors 114, 116, 118, and 120 and secondary winding 112 may decrease as it is taken over by auxiliary current $I_{aux}$. In some embodiments, a reverse in polarity across secondary winding 112 may be achieved during phase 1 when auxiliary current $I_{aux}$ exceeds output current $I_{out}$. Pre-charging auxiliary inductor 122 may reduce the transition times of the voltages across the primary and secondary windings of the transformer during phases 2 and 3, as described below. Pre-charging auxiliary inductor may also reduce body diode losses of full-bridge 103 as phase 2 may begin near the time when auxiliary current $I_{aux}$ is above output current $I_{out}$, as shown by curves 170 and 172.

At the beginning of phase 2, the short in full-bridge 103 is removed and the transition of the voltages across the primary and secondary windings of the transformer is started. Specifically, the transistors that are to be turned off according to the synchronous rectification process are turned off at the beginning of phase 2. For example, transistors 116 and 118 are turned off, as shown by signals $S_{116}$ and $S_{118}$. The transistor in full-bridge 101 that is to be turned off according to the phase-shifted process is also turned off at this time. For example, transistor 104 is turned off, as shown by signal $S_{104}$, thereby beginning the dead-time of the leading leg. During phase 2, current begins to flow into secondary winding 112. When auxiliary current $I_{aux}$ exceeds output current $I_{out}$, a portion of auxiliary current $I_{aux}$ raises the voltage at node $V_3$, as shown in curve 176. When auxiliary current $I_{aux}$ becomes bigger than output current $I_{out}$, as shown by curves 170 and 172, a portion of the excess current may flow through secondary winding 112, forcing the transition of the voltages across the primary and secondary windings of the transformer to complete.

Auxiliary transistor 124 may be turned off at the beginning of phase 3. During phase 3, auxiliary current $I_{aux}$ may decrease since auxiliary transistor 124 is off. Phase 3 may be considered a safety phase to allow for voltages $V_{110}$ and $V_{112}$ to fully transition. The transistor that was to be turned on in full-bridge 101 according to the phase-shifted process may be turned on with ZVS at the beginning of phase 4, thereby ending the dead-time of the leading leg. Auxiliary current $I_{aux}$ settles at the end of phase 4. Auxiliary current $I_{aux}$ may settle below zero, for example, because auxiliary capacitor 128 has been discharged, thereby causing the voltage at node $V_4$ to be lower than the voltage at node $V_2$. The negative value of current $I_{aux}$, as shown by curve 172, may indicate that auxiliary capacitor 128 is being charged, which occurs during phase 0. Auxiliary capacitor 128 may be charged through the body diode of auxiliary transistor 124. Once auxiliary capacitor 128 is fully charged, auxiliary current $I_{aux}$ may become zero, as shown by curve 172.

Figure 1D:
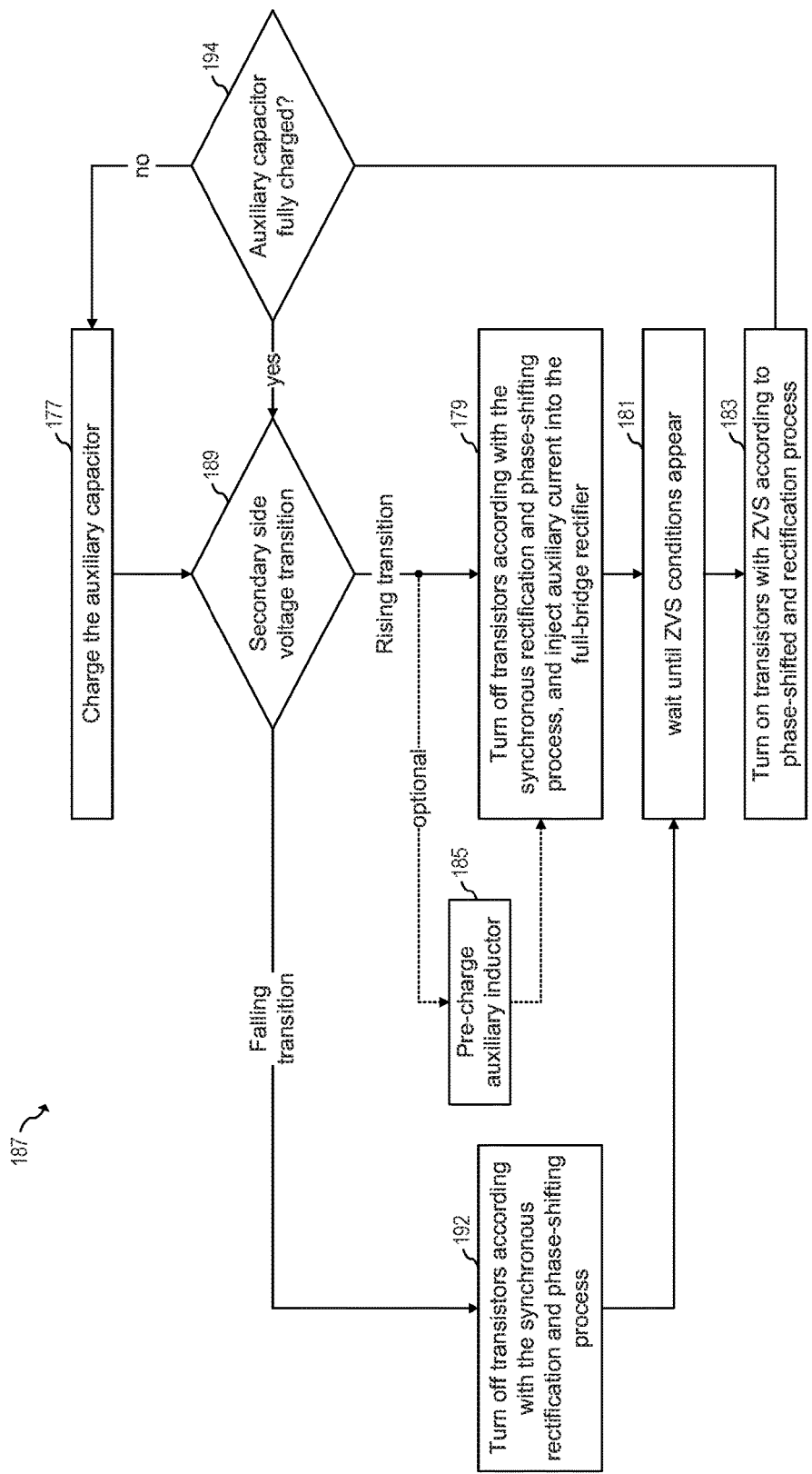
FIG. 1D illustrates a flow chart of an embodiment method of operating a full-bridge converter, according to an embodiment of the present invention.

FIG. 1D illustrates a flow chart of embodiment method 187 of operating full-bridge converter 100, according to an embodiment of the present invention. Method 187 may be used to create ZVS for all transistors of a full-bridge synchronous rectifier as well as for all transistors of a full-bridge of the primary side of the transformer of a full-bridge converter with phase-shifted operation. ZVS is achieved by injecting an auxiliary current into the full-bridge converter before the full-bridge converter switches. Method 187 may be implemented with full-bridge converter 100. Alternatively, method 187 may be implemented with other circuit architectures and in other ways known in the art, including converters that lack a transformer, such as, for example, buck converters. The discussion that follows assumes that full-bridge converter, as shown in FIG. 1A, implements method 187 of operating a full-bridge converter.

During step 177, an auxiliary capacitor, such as auxiliary capacitor 128, may be charged. The auxiliary capacitor may provide energy storage to be used for injecting the auxiliary current. An auxiliary transistor, such as auxiliary transistor 124, coupled to the auxiliary capacitor may be off during step 177. In such a case, the charging of the auxiliary capacitor may be achieved by allowing current to flow through the body diode of the auxiliary transistor. In some embodiments, the auxiliary transistor may be turned on to charge the auxiliary capacitor through its load path. In such a case, the auxiliary transistor may be turned off when a condition arises that would discharge the auxiliary capacitor through the load path of the auxiliary transistor.

During step 189, a controller, such as controller 134, may determine whether the upcoming voltage transition of a secondary side voltage, such as of node $V_2$, is a rising transition or a falling transition. The determination may be made based on previous transitions, the monitoring of currents, or in any other way known in the art.

In the case of a rising transition, the controller may turn off transistors of the full-bridge converter according to the synchronous rectification and phased-shifted process during step 179. For example, the timing diagram of FIG. 1B illustrates how a phase-shifted process and a synchronous rectification process in a full-bridge converter may switch the transistors inside the full-bridge converter. During step 179, an auxiliary circuit, such as auxiliary circuit 186, may inject an auxiliary current into the full-bridge synchronous rectifier. The turning off of the transistors during step 179 causes at least a portion of the injected auxiliary to raise the secondary side voltage and at least a portion of the auxiliary current may flow through the secondary winding of the transformer. The injection of the auxiliary current, therefore, causes the voltage across the primary and secondary winding of the transformer to commutate. The controller, therefore, may proceed to wait for ZVS conditions to appear during step 181. During optional step 185, the auxiliary inductor may be pre-charged such that it is already at least partially charged when the transistors are turned off during step 179.

The auxiliary current may be injected, for example, into node $V_2$, by, for example, auxiliary circuit 186. The auxiliary current may be provided by an auxiliary inductor, such as auxiliary inductor 122. It is understood that the auxiliary current may be injected from other types of current sources known in the art.

In case of a falling transition during step 189, the controller may turn off transistors of the full-bridge converter according to the synchronous rectification and phased-shifted process during step 192, and then proceed to wait for a ZVS conditions to appear during step 181.

During steps 181, the controller may wait a period of time sufficient for ZVS conditions to appear in the full-bridge of the primary side of the transformer. During step 181, the system waits for the voltages across the primary and secondary windings of the transformer to finish commutating. The wait may be of 50 ns, but other wait times may be used. The wait time used in step 181 may depend, for example, on the switching frequency, the size of the transformer, the voltages and currents used in the system, and the size of the storage elements used in the system.

In the case of a rising transition during step 189, the controller may turn off the auxiliary transistor during either step 179 or step 181. In such a case, therefore, the auxiliary current may be decreasing during step 181. The auxiliary current, however, may remain higher than an output current of the full-bridge converter, such as current $I_{out}$.

Once the voltages across the primary and secondary winding of the transformer finish commutating, the controller turns on the transistors of the full-bridge converter with ZVS according to the phase-shifted and synchronous rectification process during step 183. It is understood that if ZVS is not achieved, QZVS may still be achieved during step 183.

The auxiliary capacitor may be charged during periods of time when the auxiliary current is not being injected. For example, if the auxiliary capacitor is not fully charged during step 194, the auxiliary capacitor may be charged during step 177. Such may be the case when step 194 follows a rising transition. If the auxiliary capacitor is fully charged during step 194, the charging of the capacitor may be skipped and step 189 follows step 194. Such may be the case when step 194 follows a falling transition. The determination of whether to charge the auxiliary capacitor may be made by the controller. Alternatively, the system architecture may automatically charge the auxiliary capacitor when needed, which is the case of, for example, full-bridge converter 100.

Figure 1E:
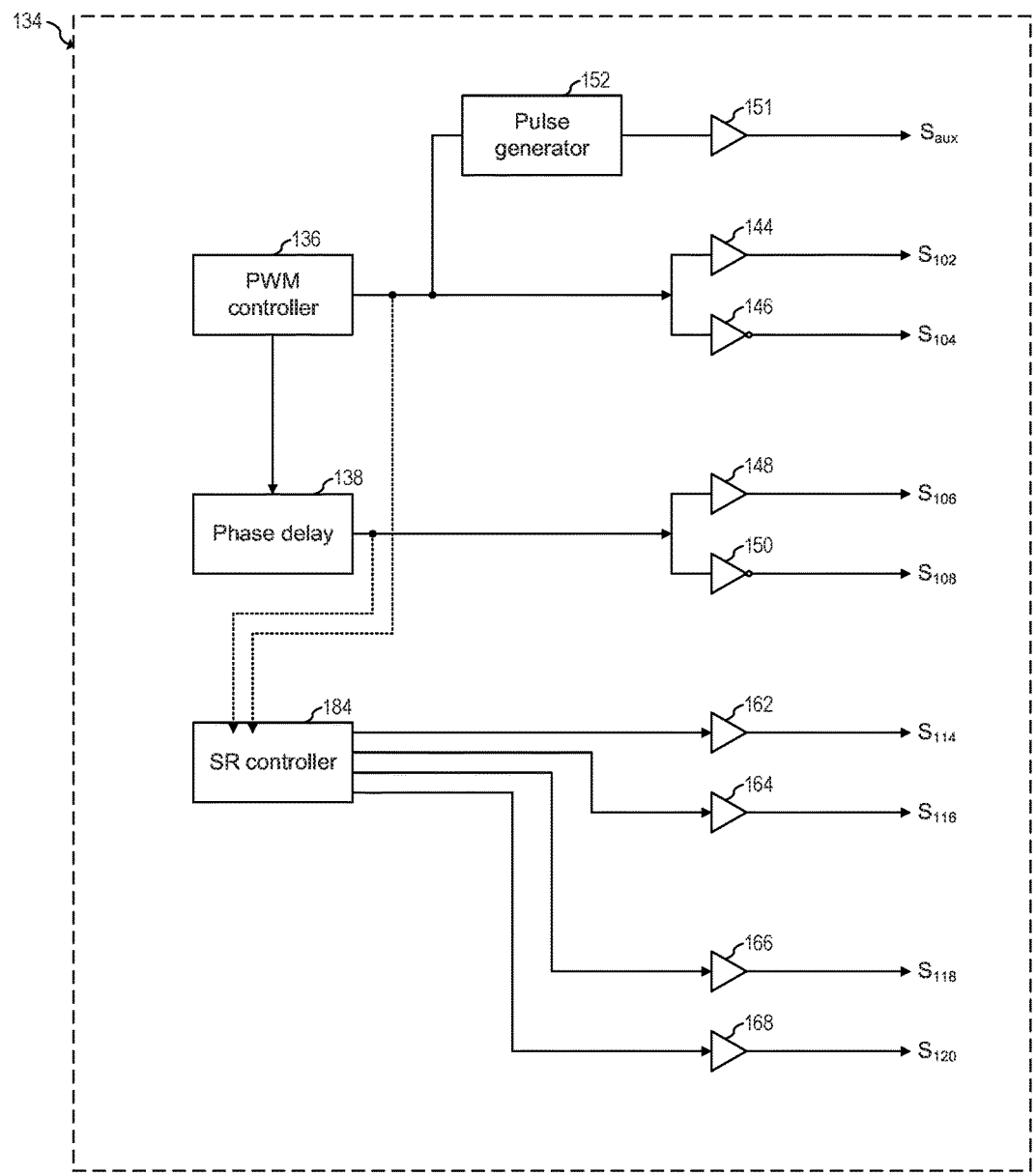
FIG. 1E shows a controller, according to an embodiment of the present invention.

FIG. 1E shows controller 134, according to an embodiment of the present invention. Controller 134 includes drivers 144, 146, 148, 150, 151, 162, 164, 166 and 168, PWM controller 136, phase delay circuit 138, SR controller 184, and pulse generator circuit 152. Controller 134 may be implemented in other ways known in the art.

As can be seen from FIG. 1E, PWM controller 136 may control drivers 144 and 146 to generate signals $S_{102}$ and $S_{104}$. Signals $S_{102}$ and $S_{104}$ may switch at 50% duty cycle, but other duty cycles may be used. Additional circuitry (not shown) may be added to ensure a dead-time that is long enough to prevent shoot-through current and allow for ZVS transitions.

PWM controller 136 may also control phase delay circuit 138, which controls the phase delay between the first leg and the second leg by controlling signals $S_{106}$ and $S_{10s}$ via drivers 148 and 150. Signals $S_{106}$ and $S_{108}$ may also be 50% duty cycle signals but other duty cycles may be used. Additional circuitry (not shown) may be added to ensure a dead-time that is long enough to prevent shoot-through current and allow for ZVS transitions.

SR controller 184 may be a synchronous rectifier controller that generates signals $S_{114}$, $S_{116}$, $S_{118}$, and $S_{120}$ via drivers 162, 164, 166, and 168. SR controller 184 may be implemented in any way known in the art. For example, SR controller 184 may control signals $S_{114}$, $S_{116}$, $S_{118}$, and $S_{120}$ by monitoring the output of PWM controller 136 and phase delay circuit 138. Alternatively, SR controller 184 may control signals $S_{114}$, $S_{116}$, $S_{118}$, and $S_{120}$ by monitoring a current in the full-bridge rectifier. Other implementations are also possible.

Pulse generator circuit 152 may be configured to generate auxiliary signal $S_{aux}$ via driver 151. Auxiliary signal $S_{aux}$ may pulse before any of signals $S_{102}$, $S_{104}$, $S_{106}$ and $S_{108}$ turns on. A way to achieve this is by delaying signals $S_{102}$, $S_{104}$, $S_{106}$, and $S_{108}$ while using the output PWM controller 136 to control pulse generator circuit 152. A way to delay signals $S_{102}$, $S_{104}$, $S_{106}$, and $S_{108}$ is, for example, by introducing a delay in drivers 144, 146, 148 and 150. Additional delays may be added. Alternatively, other implementations for delaying signals $S_{102}$, $S_{104}$, $S_{106}$, and $S_{108}$ may be used.

Pulse generator 152 may be implemented in various ways. For example, pulse generator may be implemented with a one-shot circuit configured to trigger on the rising and falling transition of its input. Alternatively, pulse generator 152 may be implemented with a controller, custom logic, or any other way known in the art.

Drivers 144, 146, 148, 150, 151, 162, 164, 166, and 168 may be implemented in any way known in the art. For example, drivers 144, 148, 151, 162, and 166 may be high-side drivers while drivers 146, 150, 164 and 168 may be low-side drivers. In some embodiments, drivers 151, 162, 164, 166 and 168 may be galvanically isolated from PWMV controller 136, and SR controller 184. Other embodiments may galvinically isolate other parts of the system. For example, SR controller 184 may be galvanically isolated from PWM controller 136.

Figure 2A:
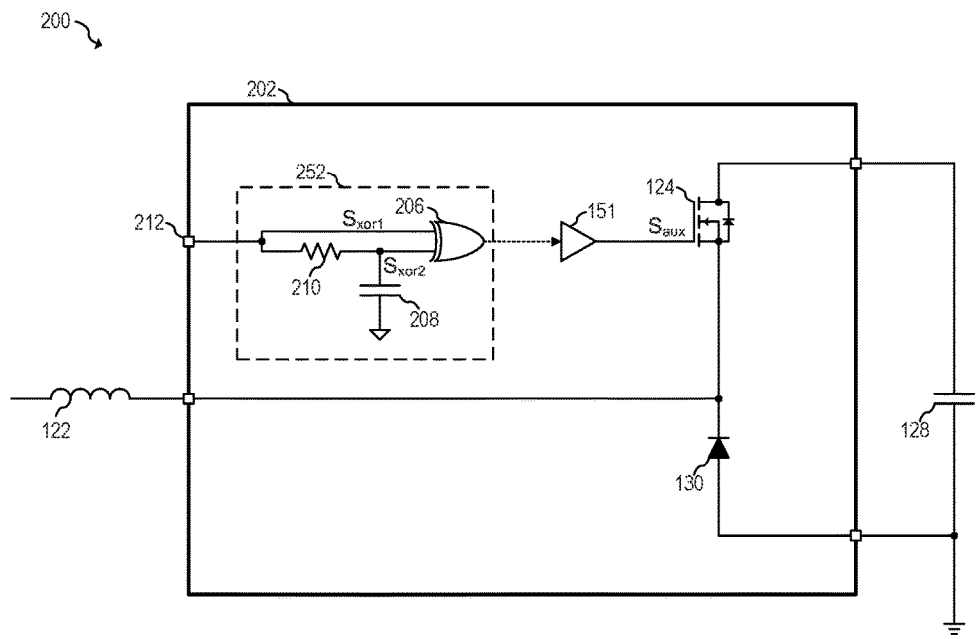
FIG. 2A shows an auxiliary circuit, according to an embodiment of the present invention.

FIG. 2A shows auxiliary circuit 200, according to an embodiment of the present invention. Auxiliary circuit 200 may be added to a traditional implementation of a full-bridge converter using phase-shifted operations and synchronous rectification in order to achieve ZVS during normal operation. Auxiliary circuit 200 includes integrated circuit (IC) 202, auxiliary inductor 122 and auxiliary capacitor 128. IC 202 includes pulse generator circuit 252, driver 151, auxiliary transistor 124, and auxiliary diode 130. Pulse generator 252 includes resistor 210, capacitor 208, and XOR gate 206.

During normal operation, terminal 212 may be driven by the same signal driving the leading leg of the full-bridge converter. Resistor 210 and capacitor 208 form a low pass filter. When terminal 212 transitions from low to high, signal $S_{xor1}$ transitions from low to high and signal $S_{aux}$ will be high until the signal $S_{xor2}$ becomes high. Similarly, when terminal 212 transitions from high to low, signal $S_{xor1}$ transitions from high to low and signal $S_{aux}$ will be high until signal $S_{xor2}$ goes low. The values of resistor 210 and capacitor 208 may be adjusted to control the duration of the pulse, which may last 100 ns. Other durations may be used.

In some embodiments, pulse generator circuit 252 may be electrically isolated from other components of auxiliary circuit 200. For example, pulse generator 252 may be galvanically isolated from driver 151. Other embodiments may implement pulse generator circuit electrically connected to driver 151.

IC 202 may be implemented in the same package and in the same substrate. Alternatively, IC 202 may be implemented in a multi-chip package. In some embodiments, IC 202 may integrate other components of a converter, such as, for example, a controller. Other embodiments may implement the components of IC 202 discretely.

Figure 2B:
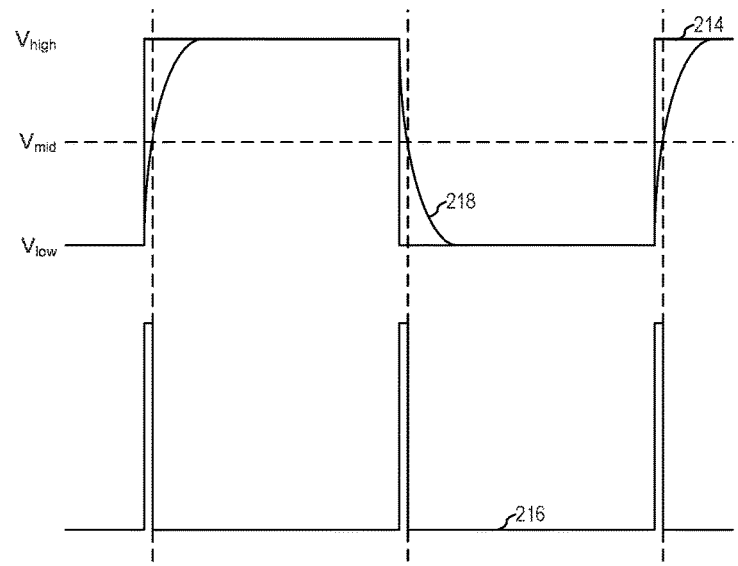
FIG. 2B shows waveforms of auxiliary circuit 200, according to an embodiment of the present invention.

FIG. 2B shows waveforms of auxiliary circuit 200, according to an embodiment of the present invention. Specifically, curve 214 corresponds to the signal $S_{xor1}$, curve 218 corresponds to signal $S_{xor2}$ and curve 216 corresponds to signal $S_{aux}$. As shown in FIG. 2B, when curve 216 transitions from low to high, curve 216 goes high until curve 218 goes above voltage $V_{mid}$. Similarly, when curve 216 transitions from high to low, curve 216 goes high until curve 218 goes below voltage $V_{mid}$. Voltage $V_{mid}$ may be in between voltage $V_{high}$ and voltage $V_{low}$, such as exactly in the middle. Voltage $V_{mid}$ may have other values and may include hysteresis. Voltage $V_{low}$ may be 0 V, but other values may be used. Voltage $V_{high}$ may include 1.8 V, 2.5 V, 3.3 V, 5V, and 12 V but other voltages may be used.

Advantages of some embodiments include that an auxiliary circuit may be used in conjunction with traditional full-bridge controllers and traditional full-bridge implementations. In other words, by using the auxiliary circuit together with traditional full-bridge implementations, ZVS may be achieved across the full range of loads and power levels while, at the same time, using transformers with good primary-to-secondary coupling. Thus, efficiency may be improved by ZVS as well as by using a transformer with good coupling.

Figure 3:
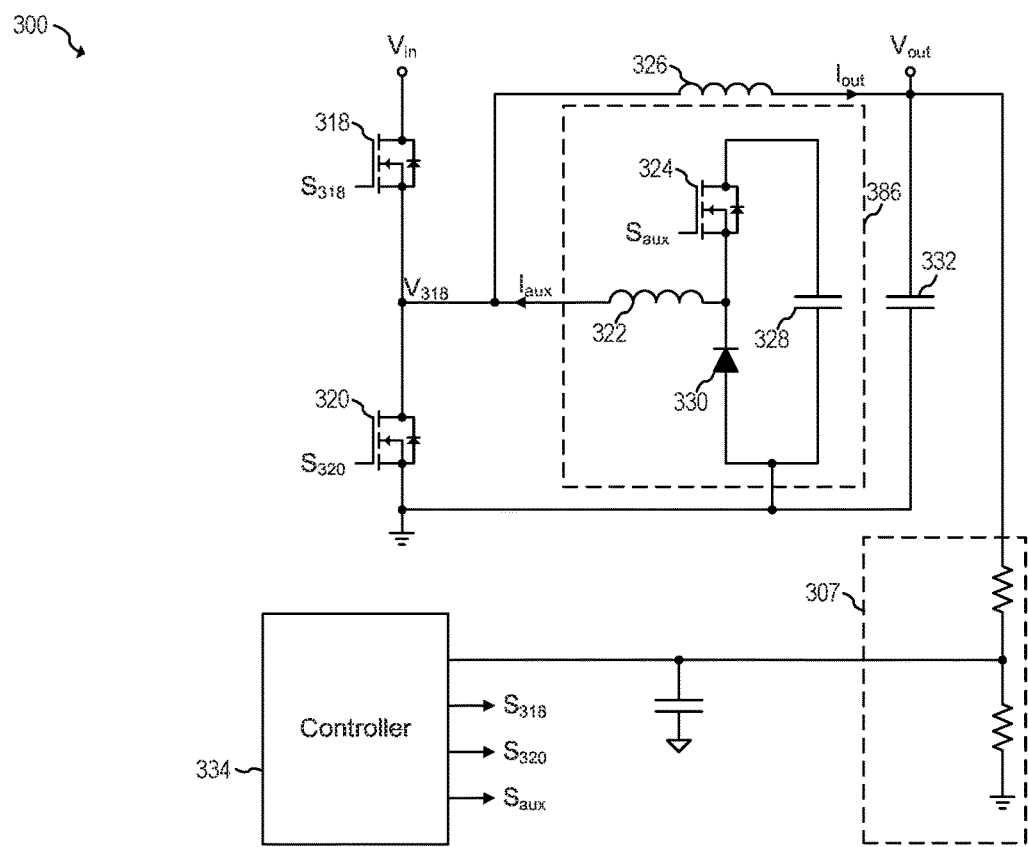
FIG. 3 shows a buck converter according to an embodiment of the present invention.

Embodiments of the present invention may also be implemented in converters with topologies that do not include a full-bridge and a transformer, such as other DC-DC topologies. For example, some embodiments may be implemented with different half-bridge topologies, such as a buck topology. Other half-bridge topologies may be used. For example, FIG. 3 shows buck converter 300, according to an embodiment of the present invention. Buck converter 300 includes transistors 318 and 320, inductor 326, capacitor 332, auxiliary circuit 386, feedback network 307 and controller 334. Auxiliary circuit 386 includes auxiliary inductor 322, auxiliary capacitor 328, auxiliary transistor 324 and auxiliary diode 330.

Buck converter 300 may provide a regulated voltage at output $V_{out}$, which may be coupled to a load (not shown). During normal operation, buck converter 300 may switch transistors 318 and 320 following techniques known in the art. Auxiliary circuit 386 may inject an auxiliary current to raise the voltage at node $V_{318}$ during the dead-time prior to turning on transistor 318, thereby creating ZVS for transistor 318. ZVS in transistor 320 may be achieved naturally. In other words, output current $I_{out}$ flowing through inductor 326 may lower the voltage at node V318 during the dead-time prior to turning on transistor 320, thereby creating ZVS for transistor 320.

Auxiliary circuit 386 may behave in a similar manner as auxiliary circuit 186. Consequently, auxiliary circuit 386 may be implemented in a similar manner than auxiliary circuit 186. A person skilled in the art, however, would recognize differences in control between auxiliary circuit 386 and auxiliary circuit 186. For example, controller 334 may pulse signal $S_{aux}$ following a different timing pattern than controller 134. In the case of auxiliary circuit 386, controller 334 may pulse signal $S_{aux}$ during the dead-time prior to turning on transistor 318. The techniques explained in method 187 of operating a full-bridge converter still apply to buck converter 300 with appropriate modifications.

Example embodiments of the present invention are summarized here. Other embodiments can also be understood from the entirety of the specification and the claims filed herein.

Example 1

A method of operating a converter including a transformer having a first winding and a second winding; a first full-bridge coupled to the first winding of the transformer; and a rectifier circuit coupled to the second winding of the transformer; the method comprising: injecting an auxiliary current into the rectifier circuit, where the injected auxiliary current causes a voltage across a transistor of the first full-bridge to decrease; and turning on the transistor of the first full-bridge a first time period after injecting the auxiliary current.

Example 2

The method of example 1, where injecting the auxiliary current includes injecting the auxiliary current during a dead-time of the first full-bridge.

Example 3

The method of one of examples 1 or 2, where the transformer has a leakage inductance lower than 1% of a magnetizing inductance of the transformer.

Example 4

The method of one of examples 1-3, where the first full-bridge is operated as a phase-shifted full-bridge.

Example 5

The method of one of examples 1-4, where the rectifier circuit includes a second full-bridge operated as a full-bridge synchronous rectifier.

Example 6

The method of one of examples 1-5, where injecting the auxiliary current into the second full-bridge includes: injecting the auxiliary current into the second full-bridge when the second full-bridge is shorted; and turning off transistors in the second full-bridge such that the injected auxiliary current flows through the second winding.

Example 7

The method of one of examples 1-6, where injecting the auxiliary current into the second full-bridge includes turning on an auxiliary transistor, the auxiliary transistor coupled between an auxiliary capacitor and an auxiliary inductor, the auxiliary inductor coupled to the second full-bridge.

Example 8

A circuit comprising a controller configured to be coupled to a first full-bridge coupled to a first winding of a transformer, a second full-bridge coupled to a second winding of the transformer, and an auxiliary circuit coupled to the second full-bridge, the controller configured to: inject an auxiliary current into the second full-bridge through the auxiliary circuit, where the injected auxiliary current causes a voltage across a transistor of the first full-bridge to decrease, and turn on the transistor of the first full-bridge a first time period after injecting the auxiliary current.

Example 9

The circuit of example 8, where the controller is further configured to inject the auxiliary current during a dead-time of the first full-bridge.

Example 10

The circuit of one of examples 8 or 9, further comprising: the first full-bridge; the second full-bridge; the transformer; and the auxiliary circuit.

Example 11

The circuit of one of examples 8-10, where the auxiliary circuit includes: an auxiliary capacitor having a first node coupled to a first supply node; a diode having an anode coupled to the first supply node; an auxiliary switch coupled between a cathode of the diode and a second node of the auxiliary capacitor; and an auxiliary inductor coupled between the cathode of the diode and the second full-bridge, where injecting an auxiliary current into the second full-bridge includes injecting a current into the second winding of the transformer through the auxiliary inductor.

Example 12

The circuit of one of examples 8-11, where the auxiliary switch is an NMOS transistor.

Example 13

The circuit of one of examples 8-12, where the auxiliary capacitor is charged through a body diode of the auxiliary NMOS transistor.

Example 14

The circuit of one of examples 8-13, where the controller is further configured to: pre-charge the auxiliary inductor prior to injecting the auxiliary current into the second winding of the transformer.

Example 15

The circuit of one of examples 8-14, where: the first full-bridge operates as a phase-shifted full-bridge; and the second full-bridge operates as a full-bridge synchronous rectifier.

Example 16

The circuit of one of examples 8-15, where: the first full-bridge includes four NMOS transistors; and the second full-bridge includes four NMOS transistors.

Example 17

A circuit comprising: a transformer having a first winding and a second winding; a first full-bridge coupled to the first winding of the transformer; a second full-bridge coupled to the second winding of the transformer; and an auxiliary circuit comprising an auxiliary capacitor having a first node coupled to a first supply node, a diode having an anode coupled to the first supply node, an auxiliary switch coupled between a cathode of the diode and a second node of the auxiliary capacitor, and an auxiliary inductor coupled between the cathode of the diode and the second full-bridge.

Example 18

The circuit of example 17, further comprising: a synchronous rectifier controller coupled to the second full-bridge; a phase-shifted full-bridge controller coupled to the first full-bridge; and an auxiliary controller coupled to the auxiliary circuit.

Example 19

The circuit of one of examples 17 or 18, where the synchronous rectifier controller, the phase-shifted full-bridge controller and the auxiliary controller are implemented inside the same integrated circuit.

Example 20

The circuit of one of examples 17-19, where the first full-bridge includes four MOS transistors; the second full-bridge includes four MOS transistors; and the auxiliary switch includes an MOS transistor.

Example 21

A circuit comprising: a diode having an anode coupled to a supply node; an auxiliary switch having a first load path terminal and a second load path terminal, the first load path terminal coupled to a cathode of the diode and configured to be coupled to an auxiliary inductor, the second load path terminal configured to be coupled to an auxiliary capacitor; and a pulse generator coupled to a gate of the auxiliary switch.

Example 22

The circuit of example 21, where the auxiliary inductor is configured to be coupled to a full-bridge synchronous rectifier.

Example 23

The circuit of one of examples 21 or 22, where the auxiliary inductor is configured to be coupled to a half-bridge of a buck converter.

Example 24

The circuit one of examples 21-23, further comprising the auxiliary inductor and the auxiliary capacitor.

Example 25

The circuit of one of examples 21-24, where the pulse generator is galvanically isolated from the auxiliary switch.

Example 26

The circuit of one of examples 21-25, where the pulse generator, the diode, and the auxiliary switch are integrated in the same package.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a converter comprising a transformer having a first winding and a second winding; a first full-bridge coupled to the first winding of the transformer; and a rectifier circuit coupled to the second winding of the transformer; the method comprising:
injecting an auxiliary current into the rectifier circuit via an auxiliary inductor that is directly connected to the rectifier circuit, wherein the injected auxiliary current causes a voltage across a transistor of the first full-bridge to decrease, and injecting the auxiliary current into the rectifier circuit comprises connecting the auxiliary inductor to an auxiliary capacitor by turning on an auxiliary transistor coupled between the auxiliary capacitor and the auxiliary inductor;
disconnecting the auxiliary inductor from the auxiliary capacitor by turning off the auxiliary transistor; and
turning on the transistor of the first full-bridge a first time period after injecting the auxiliary current.

2. The method of claim 1, wherein a diode is coupled between a first load path terminal of the auxiliary transistor and a power supply node, the auxiliary capacitor is coupled between a second load path terminal of the auxiliary transistor and the power supply node, a first terminal of the auxiliary inductor is coupled to the rectifier circuit, and a second terminal of the auxiliary inductor is operatively coupled to the first load path terminal of the auxiliary transistor.

3. The method of claim 1, wherein injecting the auxiliary current comprises injecting the auxiliary current during a dead-time of the first full-bridge.

4. The method of claim 1, wherein the transformer has a leakage inductance lower than 1% of a magnetizing inductance of the transformer.

5. The method of claim 1, wherein the first full-bridge is operated as a phase-shifted full-bridge.

6. The method of claim 1, wherein the rectifier circuit comprises a second full-bridge operated as a full-bridge synchronous rectifier.

7. The method of claim 6, wherein injecting the auxiliary current into the second full-bridge comprises:
injecting the auxiliary current into the second full-bridge when the second full-bridge is shorted; and
turning off transistors in the second full-bridge such that the injected auxiliary current flows through the second winding.

8. A main circuit comprising a controller configured to be coupled to a first full-bridge coupled to a first winding of a transformer, a second full-bridge coupled to a second winding of the transformer, and an auxiliary circuit coupled to the second full-bridge, the controller configured to:
inject an auxiliary current into the second full-bridge through an auxiliary inductor of the auxiliary circuit that is directly connected to the second full-bridge, wherein the injected auxiliary current causes a voltage across a transistor of the first full-bridge to decrease, and
turn on the transistor of the first full-bridge a first time period after injecting the auxiliary current, wherein the auxiliary circuit comprises:
an auxiliary capacitor having a first node coupled to a first supply node,
a diode having an anode coupled to the first supply node,
an auxiliary switch coupled between a cathode of the diode and a second node of the auxiliary capacitor, and
the auxiliary inductor coupled between the cathode of the diode and the second full-bridge, wherein injecting the auxiliary current into the second full-bridge comprises injecting a current into the second winding of the transformer through the auxiliary inductor, wherein the auxiliary switch is configured to disconnect the cathode of the diode and the auxiliary inductor from the second node of the auxiliary capacitor when the auxiliary switch is off.

9. The main circuit of claim 8, wherein the controller is further configured to inject the auxiliary current during a dead-time of the first full-bridge.

10. The main circuit of claim 8, further comprising:
the first full-bridge;
the second full-bridge;
the transformer; and
the auxiliary circuit.

11. The main circuit of claim 8, wherein the auxiliary switch is an auxiliary NMOS transistor.

12. The main circuit of claim 11, wherein the auxiliary capacitor is charged through a body diode of the auxiliary NMOS transistor.

13. The main circuit of claim 8, wherein the controller is further configured to:
pre-charge the auxiliary inductor prior to injecting the auxiliary current into the second winding of the transformer.

14. The main circuit of claim 8, wherein:
the first full-bridge operates as a phase-shifted full-bridge; and
the second full-bridge operates as a full-bridge synchronous rectifier.

15. The main circuit of claim 8, wherein:
the first full-bridge comprises four NMOS transistors; and
the second full-bridge comprises four NMOS transistors.

16. A main circuit comprising:
a transformer having a first winding and a second winding;
a first full-bridge coupled to the first winding of the transformer;
a second full-bridge coupled to the second winding of the transformer; and
an auxiliary circuit comprising:
an auxiliary capacitor having a first node coupled to a first supply node,
a diode having an anode coupled to the first supply node,
an auxiliary switch having a first terminal coupled to a cathode of the diode and a second terminal coupled to a second node of the auxiliary capacitor, and
an auxiliary inductor coupled between the cathode of the diode and the second full-bridge, wherein the auxiliary switch is configured to disconnect the cathode of the diode and the auxiliary inductor from the second node of the auxiliary capacitor when the auxiliary switch is off.

17. The main circuit of claim 16, further comprising:
a synchronous rectifier controller coupled to the second full-bridge;
a phase-shifted full-bridge controller coupled to the first full-bridge; and
an auxiliary controller coupled to the auxiliary circuit.

18. The main circuit of claim 17, wherein the synchronous rectifier controller, the phase-shifted full-bridge controller and the auxiliary controller are implemented inside the same integrated circuit.

19. The main circuit of claim 16, wherein:
the first full-bridge comprises four MOS transistors;
the second full-bridge comprises four MOS transistors; and
the auxiliary switch comprises an MOS transistor.

20. A circuit comprising:
a diode having an anode coupled to a supply node;
an auxiliary capacitor having a first terminal coupled to the supply node;
an auxiliary inductor having a first terminal operatively coupled to a cathode of the diode;
an auxiliary switch having a first load path terminal directly connected to the cathode of the diode, and a second load path terminal coupled to a second terminal of the auxiliary capacitor, wherein the auxiliary switch is configured to disconnect the cathode of the diode and the first terminal of the auxiliary inductor from the second terminal of the auxiliary capacitor when the auxiliary switch is off; and
a pulse generator coupled to a gate of the auxiliary switch.

21. The circuit of claim 20, wherein the auxiliary inductor is configured to be coupled to a full-bridge synchronous rectifier.

22. The circuit of claim 20 wherein the auxiliary inductor is configured to be coupled to a half-bridge of a buck converter.

23. The circuit of claim 20, wherein the pulse generator is galvanically isolated from the auxiliary switch.

24. The circuit of claim 20, wherein the pulse generator, the diode, and the auxiliary switch are integrated in the same package.

25. The main circuit of claim 16, wherein the second winding is the only secondary winding of the transformer, and wherein the second winding comprises a single winding.

* * * * *